(12) United States Patent
Lin et al.

(10) Patent No.: US 9,041,482 B2
(45) Date of Patent: May 26, 2015

(54) ATTENUATION REDUCTION CONTROL STRUCTURE FOR HIGH-FREQUENCY SIGNAL TRANSMISSION LINES OF FLEXIBLE CIRCUIT BOARD (71) Applicant: ADVANCED FLEXIBLE CIRCUITS CO., LTD., Taoyuan County (TW)

(72) Inventors: Gwun-Jin Lin, Taoyuan County (TW); Kuo-Fu Su, Taoyuan County (TW); Chih-Heng Chuo, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 0 days.

(21) Appl. No.: 14/108,838

(22) Filed: Dec. 17, 2013

(65) Prior Publication Data
US 2014/0375394 A1 Dec. 25, 2014

(30) Foreign Application Priority Data
Jun. 19, 2013 (TW) .............................. 102121670 A (51) Int. Cl.
H03H 7/38 (2006.01)
H01P 1/22 (2006.01)
H01P 3/02 (2006.01)
H05K 1/00 (2006.01)

(52) U.S. Cl.
CPC .. *H01P 1/22* (2013.01); *H03H 7/38* (2013.01); *H01P 1/227* (2013.01); *H01P 3/026* (2013.01); *H05K 1/00* (2013.01)

(58) Field of Classification Search
CPC ......... H01P 3/081; H01P 3/082; H01P 3/084; H01P 3/003; H01P 1/227; H03H 7/38; H03H 7/24
USPC ...................................... 333/1, 4, 5, 81 A, 33
See application file for complete search history.

(56) References Cited

U.S. PATENT DOCUMENTS 5,682,124 A * 10/1997 Suski ................................ 333/1
6,040,524 A * 3/2000 Kobayashi et al. ............. 174/36

* cited by examiner

*Primary Examiner* — Stephen E Jones
(74) *Attorney, Agent, or Firm* — Rosenberg, Klein & Lee (57) ABSTRACT

An attenuation reduction control structure for high-frequency signal transmission lines of a flexible circuit board includes an impedance control layer formed on a surface of a substrate. The impedance control layer includes an attenuation reduction pattern that is arranged in an extension direction of the high-frequency signal transmission lines of the substrate and corresponds to bottom angle structures of the high-frequency signal transmission lines in order to improve attenuation of a high-frequency signal transmitted through the high-frequency signal transmission lines. An opposite surface of the substrate includes a conductive shielding layer formed thereon. The conductive shielding layer is formed with an attenuation reduction pattern corresponding to top angle structures of the high-frequency signal transmission lines.

25 Claims, 11 Drawing Sheets

ATTENUATION REDUCTION CONTROL STRUCTURE FOR HIGH-FREQUENCY SIGNAL TRANSMISSION LINES OF FLEXIBLE CIRCUIT BOARD

BACKGROUND OF THE INVENTION

1. Field of the Invention

The present invention relates to the design of an attenuation reduction structure for high-frequency signal transmission lines of a circuit board, and in particular to the formation of attenuation reduction patterns at locations corresponding to bottom angle structures and top angle structures for high-frequency signal transmission lines of a flexible circuit board.

2. The Related Arts

Most electronic devices are provided with circuit boards or flexible flat cables to position all necessary circuit components and connectors and realize transmission of electronic signals. In the manufacture of a circuit board, wires are laid on a surface of a substrate to form an extended signal transmission line for transmission of the electronic signals.

Figure 1:
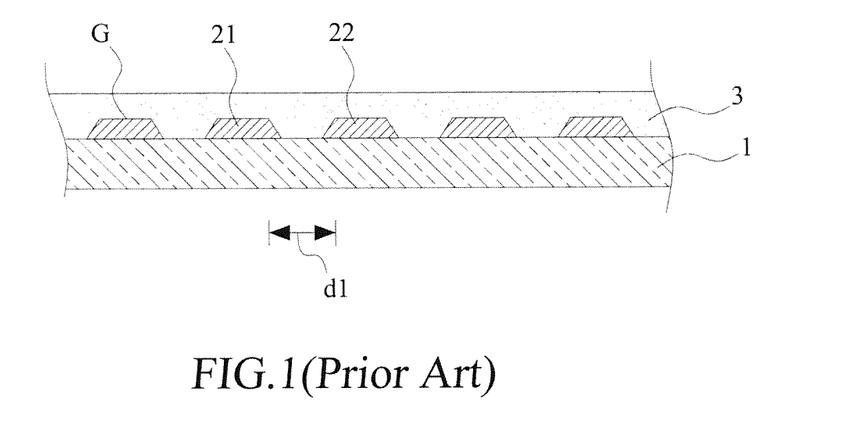
FIG. 1 is a schematic view showing a conventional flexible circuit board.
Figure 2:
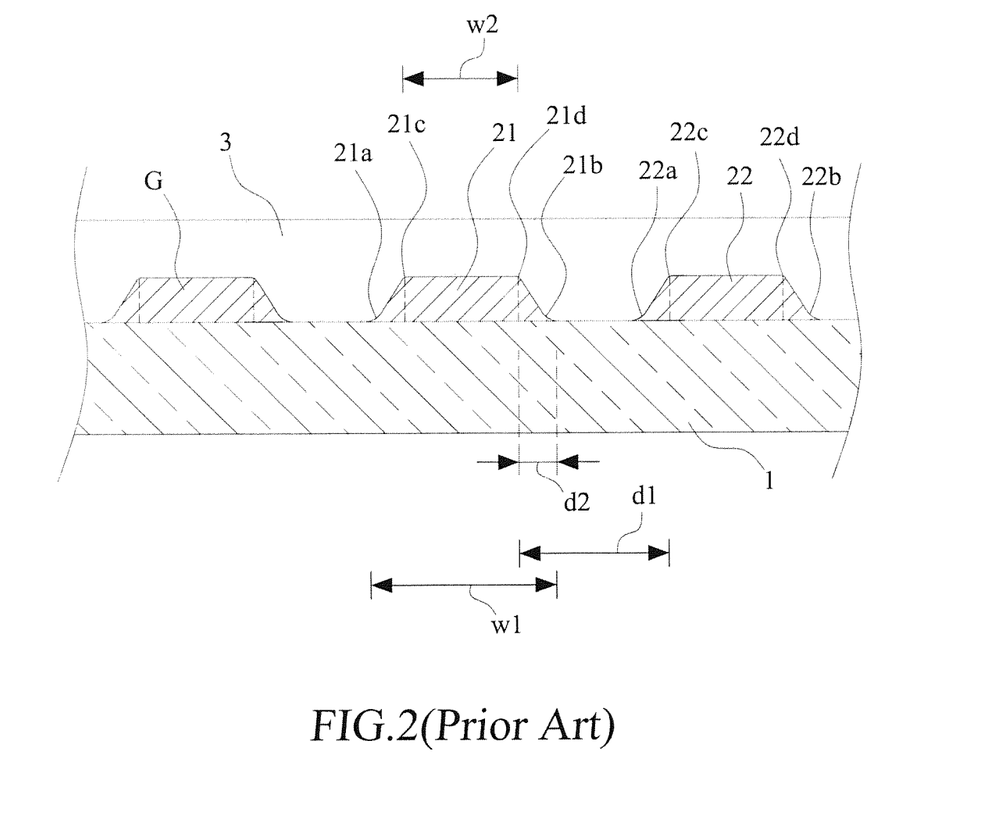
FIG. 2 is a partial enlarged view of the conventional flexible circuit board shown in FIG. 1.
Figure 3:
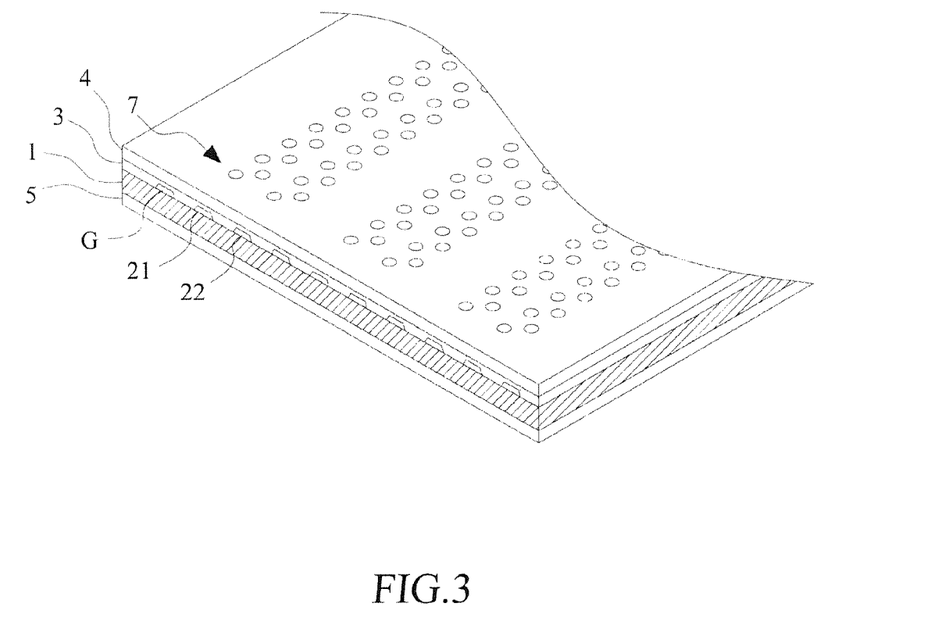
FIG. 3 is a perspective view showing a first embodiment of the present invention.
Figure 4:
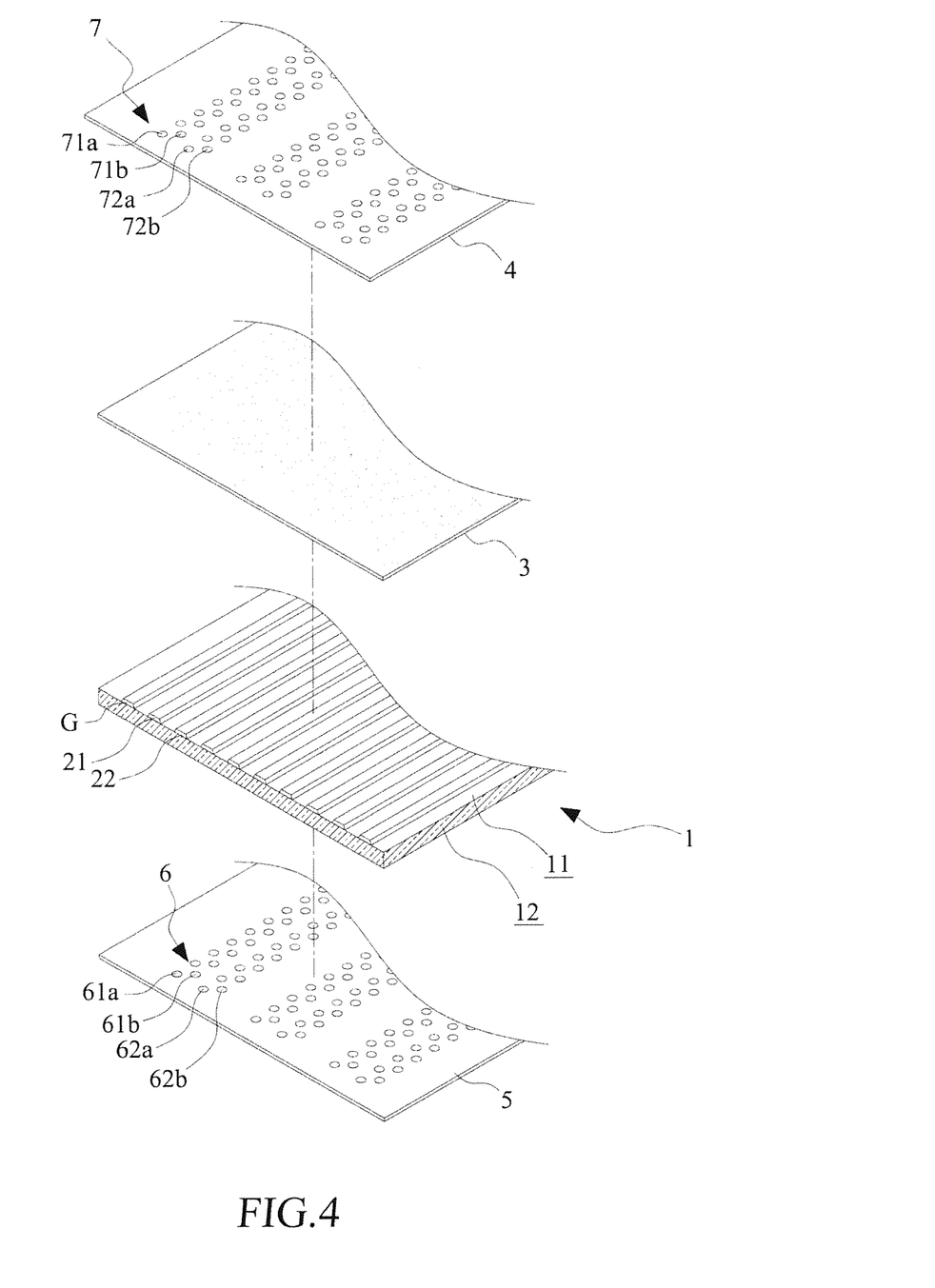
FIG. 4 is an exploded view showing components of FIG. 3 in a separated form.
Figure 5:
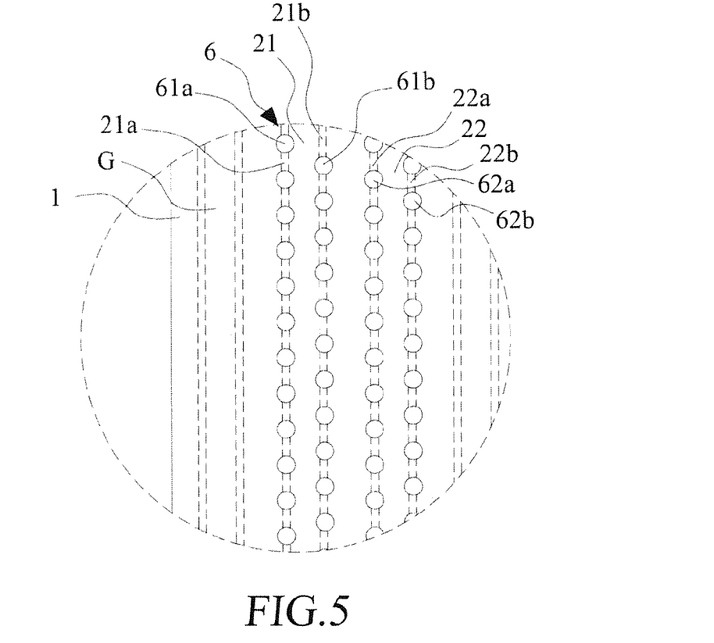
FIG. 5 is a bottom view of FIG. 3.
Figure 6:
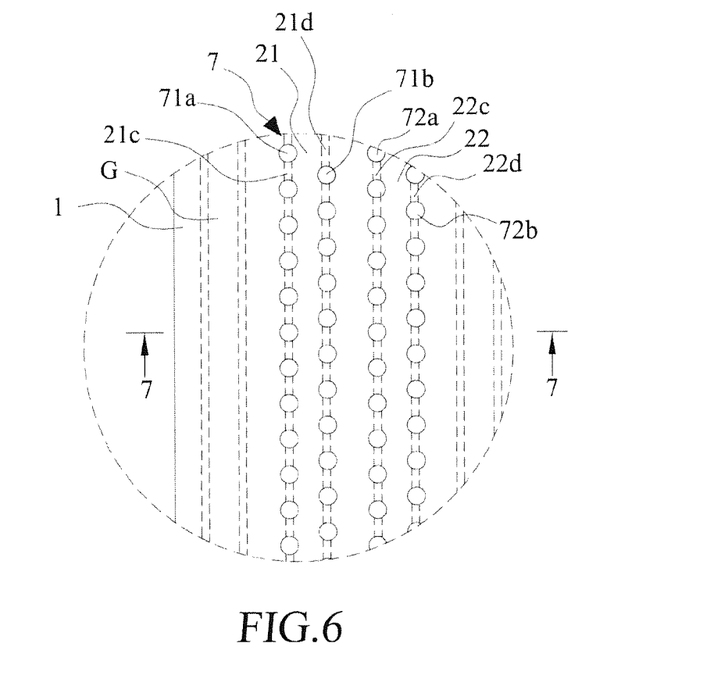
FIG. 6 is a top view of FIG. 3.

Referring to FIGS. 1 and 2, which are respectively a cross-sectional view and a partial enlarged view of a conventional flexible circuit board, as shown in the drawings, a substrate 1 comprises a first surface 11 and a second surface 12. On the first surface 11 of the substrate 1, a plurality of parallel high-frequency signal transmission lines 21. 22 is formed and spaced from each other by a predetermined spacing distance d1. The high-frequency signal transmission lines 21, 22 are arranged in pair, generally in combination with an adjacent grounding line G, to transmit at least one differential-mode signal. A covering insulation layer 3 is formed on the first surface 11 of the substrate 1 and covers surfaces of the high-frequency signal transmission lines 2 and the grounding line G.

The high-frequency signal transmission lines 2 are generally made of a copper foil material or a composite material and are of a structure having a cross-section of a substantially flat configuration. Ideally, the high-frequency signal transmission lines each have opposite sidewalls that are vertical walls. However, in a real structure, the two sidewalls of a high-frequency signal transmission line show a slope shift amount so as to each form a top angle structure. For example, the high-frequency signal transmission line 21 has two sidewalls that are supposed to be normal to the first surface 11 of the substrate 1. However, in a real structure, the two sidewalls of the high-frequency signal transmission line 21 often show a slope shift amount d2 (namely being non-vertical sidewalls), so that a left bottom corner and a right bottom corner of the high-frequency signal transmission line 2 each form a bottom angle structure 21a, 21b and a left top corner and a right top corner of the high-frequency signal transmission line 21 each form a top angle structure 21c, 21d. In other words, the high-frequency signal transmission line 21 has a bottom width w1 that is greater than a top width w2.

In the transmission of a low-frequency signal, the angle structures of the high-frequency signal transmission line does not cause any problem. However, in the transmission of a high-frequency signal, the top angle structures and the bottom angle structures may cause attenuation of the high-frequency signal. Such a situation leads to problems of poor signal transmission reliability, poor impedance control, and signal interference in the transmission of a high-frequency signal through high-frequency signal transmission lines that are commonly used in the contemporarily available electronic devices.

SUMMARY OF THE INVENTION

Thus, an object of the present invention is to provide a structure that controls signal attenuation in transmission of a high-frequency signal through a flexible circuit board, particularly an attenuation reduction pattern being provided corresponding to bottom angle structures and top angle structures for high-frequency signal transmission lines of the flexible circuit board, in order to improve the attenuation caused in the transmission of a high-frequency signal through the high-frequency signal transmission lines.

To achieve the above object, the present invention provides an impedance control layer on a surface of a substrate of a flexible circuit board. The impedance control layer comprises an attenuation reduction pattern arranged in an extension direction for high-frequency signal transmission lines of the substrate and corresponding to bottom angle structures of the high-frequency signal transmission lines so as to improve attenuation occurring in the transmission of a high-frequency signal through the high-frequency signal transmission lines.

In a preferred embodiment of the present invention, the attenuation reduction pattern comprises a plurality of openings spaced from each other by a distance and the openings are each one of a circular opening, a rectangular opening, and a rhombus opening. Further, besides being a flexible substrate, the flexible circuit board of the present invention is also applicable to a rigid-flexible board that comprises a flexible substrate combined with a rigid board.

In another preferred embodiment of the present invention, the flexible circuit board has an opposite surface on which a conductive shielding layer is formed. The conductive shielding layer is formed with an attenuation reduction pattern corresponding to top angle structures of the high-frequency signal transmission lines.

Preferably, the openings of the first attenuation reduction pattern each have a center position that is located exactly below the bottom angle structure and the openings of the first attenuation reduction pattern each have a greatest opening size that is not greater than a width of a bottom of the high-frequency signal transmission line.

Further, the openings of the second attenuation reduction pattern each have a center position that is located exactly above the bottom angle structure and the openings of the second attenuation reduction pattern each have a greatest opening size that is not greater than a width of a top of the high-frequency signal transmission line.

In respect of efficacy, the present invention provides high-frequency signal transmission lines of a flexible circuit board with an attenuation reduction control structure that provides an excellent attenuation reduction effect for transmission of a high-frequency through the high-frequency signal transmission lines, whereby an excellent effect can be obtained for both performance and reliability of signal transmission. The present invention provide an attenuation reduction pattern that provides improvement that suits the need for resisting attenuation in the transmission of a high-frequency signal through a flexible circuit board that is thin and light-weighted and is made flexible.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

With reference to the drawings and in particular to FIGS. 3-7, a substrate 1 comprises a first surface 11 and a second surface 12. A plurality of parallel high-frequency signal transmission lines 21, 22 spaced from each other by a predetermined spacing distance d1 is formed on the first surface 11 of the substrate 1. The high-frequency signal transmission lines 21, 22 are arranged in pair for transmitting at least one differential-mode signal.

The high-frequency signal transmission lines 21, 22 are generally made of a copper foil material or a composite material and are of a structure having a cross-section of a substantially flat configuration. The high-frequency signal transmission line 21 has two bottom angle structures 21a, 21b showing a slope shift amount d2. The high-frequency signal transmission line 22 has two bottom angle structures 22a, 22b, also showing such a slope shift amount. In other words, the bottom angle structures 21a, 21b, 22a, 22b of the high-frequency signal transmission lines 21, 22 provide a slope sidewall (non-vertical sidewall) structure, making an upper surface of each of the high-frequency signal transmission lines 21, 22 having a width less than a width of a lower surface thereof.

A covering insulation layer 3 is formed on the first surface 11 of the substrate 1 and covers a surface of each of the high-frequency signal transmission lines 21, 22 and a grounding line G. The covering insulation layer 3 is generally made of an insulation material and can be one of bonding sheet, coverlay, and ink.

The covering insulation layer 3 has a surface on which a conductive shielding layer 4 is formed. The conductive shielding layer 4 is made of a material that is a silver-based material layer or an equivalent conductive layer, such as one of an aluminum-based material layer, a copper-based material layer, a conductive carbon paste, and a conductive particle included resin layer.

The second surface 12 of the substrate 1 comprises an impedance control layer 5 formed thereon. The impedance control layer 5 comprises a first attenuation reduction pattern 6 arranged in the extension direction of the high-frequency signal transmission lines 21, 22 and corresponding to the bottom angle structures 21a, 21b of the high-frequency signal transmission line 21 and the bottom angle structures 22a, 22b of the high-frequency signal transmission line 22.

The first attenuation reduction pattern 6 comprises a plurality of openings 61a, 61b spaced from each other by a distance. The openings 61a, 61b are respectively set at positions corresponding to the bottom angle structures 21a, 21b of the high-frequency signal transmission line 21.

In the instant embodiment, the adjacent openings 61a, 61b corresponding to the bottom angle structures 21a, 21b of the same high-frequency signal transmission line 21 are alternated with each other by being set at mutually-shifted positions (namely being not located on the same horizontal line). Similarly, the first attenuation reduction pattern 6 also comprises a plurality of openings 62a, 62b spaced from each other by a distance. The openings 62a, 62b are respectively set at positions corresponding to the bottom angle structures 22a, 22b of the high-frequency signal transmission line 22. The openings 61a, 61b, 62a, 62b of the first attenuation reduction pattern 6 formed in the impedance control layer 5 can improve attenuation occurring in the transmission of a high-frequency signal through the high-frequency signal transmission lines 21, 22.

The impedance control layer 5 can be an extended plane formed of one of a silver-based material layer, an aluminum-based material layer, a copper-based material layer, a conductive carbon paste, a conductive particle included resin layer. The openings 61a, 61b, 62a, 62b formed in the impedance control layer 5 can each be one of a circular opening, a rectangular opening, and a rhombus opening.

Figure 7:
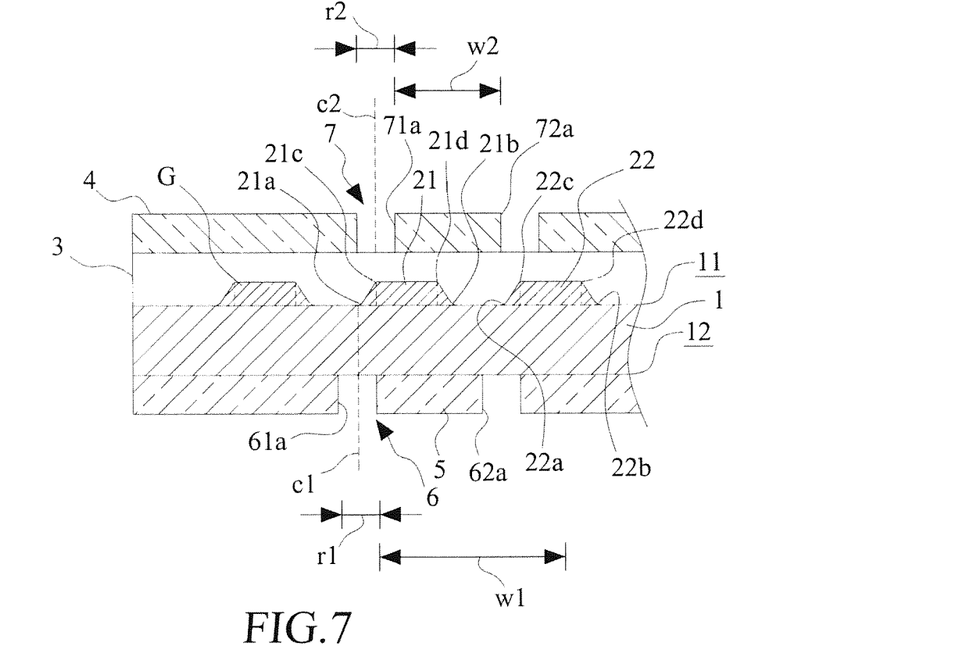
FIG. 7 is a cross-sectional view taken along line 7-7 of FIG. 6.

Preferably, each opening of the first attenuation reduction pattern has a center position located exactly below the corresponding bottom angle structure. For example, as shown in FIG. 7, the center positions c1 of the openings 61a of the first attenuation reduction pattern 6 are exactly under the corresponding bottom angle structure 21a.

Further, the greatest opening size of each opening of the first attenuation reduction pattern is not greater than the width of the bottom of the high-frequency signal transmission line. For example, the greatest opening size r1 of the openings 61a of the first attenuation reduction pattern 6 is not greater than the bottom wide w1 of the high-frequency signal transmission line 21.

Corresponding to the impedance control layer 5, the conductive shielding layer 4 that is formed on the surface of the covering insulation layer 3 is formed with a second attenuation reduction pattern 7 arranged in the extension direction of the high-frequency signal transmission lines 21, 22 and corresponding to top angle structures 21c, 21d, 22c, 22d of the high-frequency signal transmission lines 21, 22.

The second attenuation reduction pattern 7 comprises a plurality of openings 71a, 71b spaced from each other by a distance. The openings 71a, 71b are respectively set at positions corresponding to the top angle structures 21c, 21d of the high-frequency signal transmission line 21. In the instant embodiment, the adjacent openings 71a, 71b corresponding to the top angle structures 21c, 21d of the same high-frequency signal transmission line 21 are alternated with each other by being set at mutually-shifted positions (namely being not located on the same horizontal line). Similarly, the second attenuation reduction pattern 7 also comprises a plurality of openings 72a, 72b spaced from each other by a distance. The openings 72a, 72b are respectively set at positions corresponding to the top angle structures 22c, 22d of the high-frequency signal transmission line 22. The openings 71a, 71b, 72a, 72b of the second attenuation reduction pattern 7 formed in the conductive shielding layer 4 can improve attenuation occurring in the transmission of a high-frequency signal through the high-frequency signal transmission lines 21, 22.

Preferably, each opening of the second attenuation reduction pattern has a center position located exactly above the corresponding bottom angle structure. For example, as shown in FIG. 7, the center positions c2 of the openings 71a of the second attenuation reduction pattern 7 are exactly above the corresponding top angle structure 21c.

Further, the greatest opening size of each opening of the second attenuation reduction pattern is not greater than the width of the top of the high-frequency signal transmission line. For example, the greatest opening size r2 of the openings 71a of the second attenuation reduction pattern 7 is not greater than the top wide w2 of the high-frequency signal transmission line 21.

Figure 8:
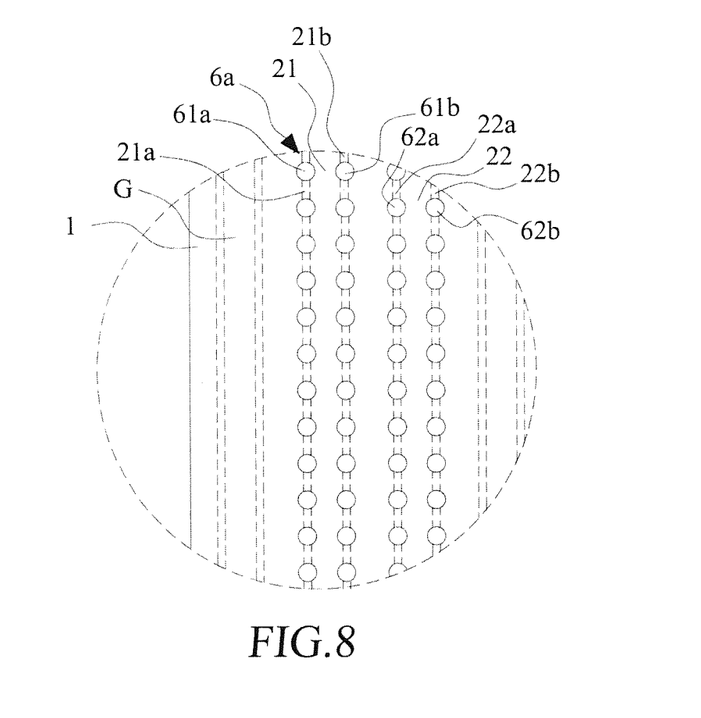
FIG. 8 is a bottom view showing a second embodiment of the present invention.
Figure 9:
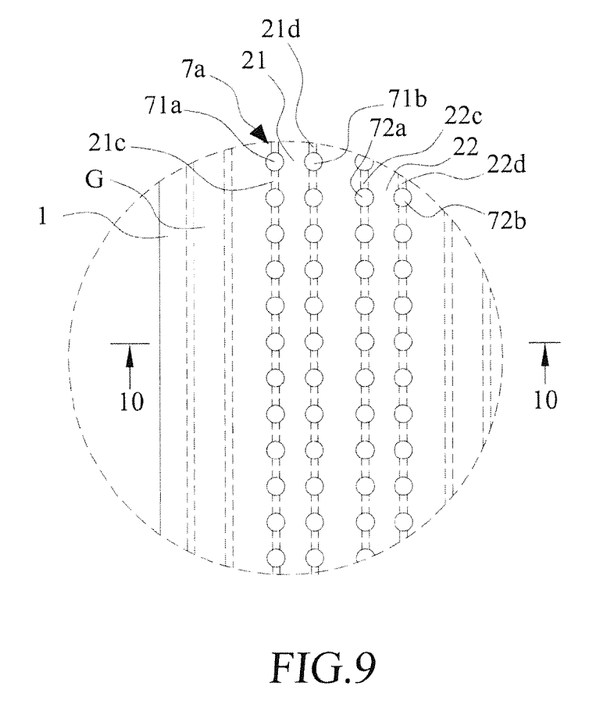
FIG. 9 is a top view showing the second embodiment of the present invention.
Figure 10:
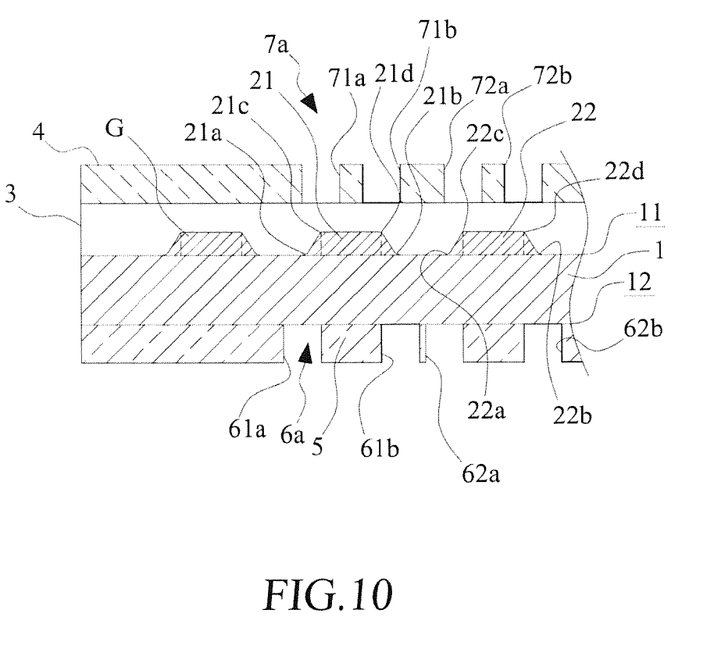
FIG. 10 is a cross-sectional view taken along line 10-10 of FIG. 9.

Referring to FIGS. 8-10, a second embodiment of the present invention is schematically shown. The instant embodiment has a structure that is substantially similar to the structure of the first embodiment and a difference is that a plurality of openings 61a, 61b of a first attenuation reduction pattern 6a of an impedance control layer 5 is set at positions that are symmetric with respect to each other (namely being located on the same horizontal line) to respectively correspond to the bottom angle structures 21a, 21b of a high-frequency signal transmission line 21. A plurality of openings 62a, 62b of the first attenuation reduction pattern 6a is arranged symmetric to each other (namely being located on the same horizontal line) to respectively correspond to the bottom angle structures 22a, 22b of an adjacent high-frequency signal transmission line 22.

Corresponding to the first attenuation reduction pattern 6a, the conductive shielding layer 4 that is formed on the surface of the covering insulation layer 3 is formed with a second attenuation reduction pattern 7a arranged in the extension direction of the high-frequency signal transmission lines 21, 22 and corresponding to top angle structures 21c, 21d, 22c, 22d of the high-frequency signal transmission lines 21, 22. The second attenuation reduction pattern 7a comprises a plurality of openings 71a, 71b respectively corresponding to the top angle structures 21c, 21d of the high-frequency signal transmission line 21 and a plurality of openings 72a, 72b respectively corresponding to the top angle structures 21c, 21d of the high-frequency signal transmission line 22.

Figure 11:
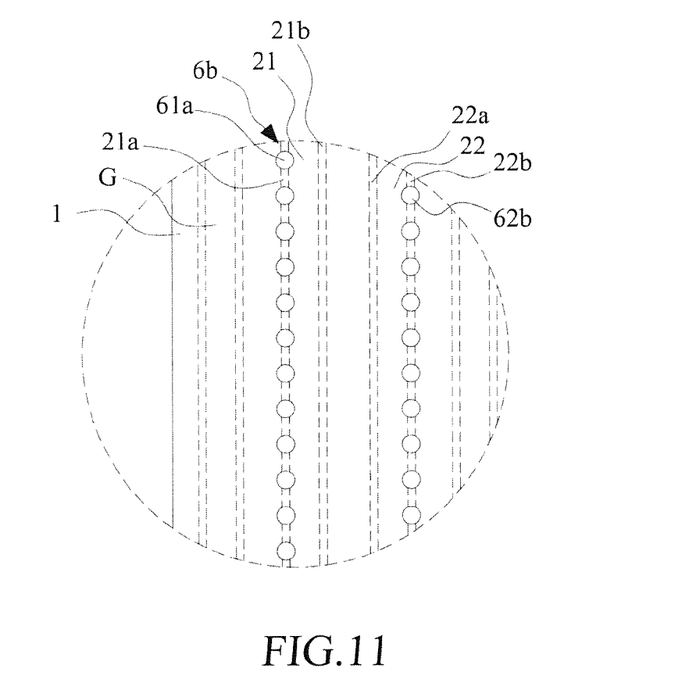
FIG. 11 is a bottom view showing a third embodiment of the present invention.
Figure 12:
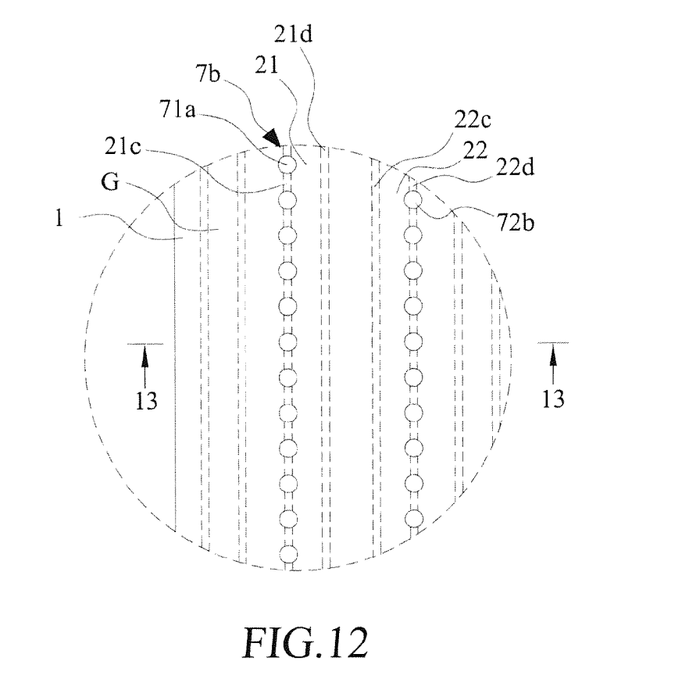
FIG. 12 is a top view showing the third embodiment of the present invention.
Figure 13:
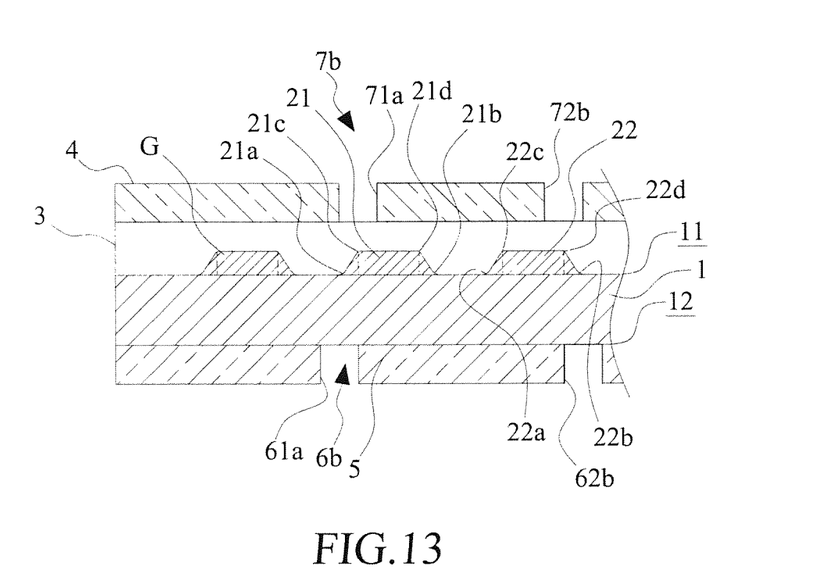
FIG. 13 is a cross-sectional view taken along line 13-13 of FIG. 12.

Referring to FIGS. 11-13, a third embodiment of the present invention is schematically shown. The instant embodiment has a structure that is substantially similar to the structure of the first embodiment and a difference is that a plurality of openings 61a of a first attenuation reduction pattern 6b of an impedance control layer 5 is set at positions that correspond to a bottom angle structure 21a of a high-frequency signal transmission line 21 and a plurality of openings 62b is set at positions corresponding to a bottom angle structure 22b of a high-frequency signal transmission line 22. Corresponding to the first attenuation reduction pattern 6b, a conductive shielding layer 4 is formed with a plurality of openings 71a, 72b respectively corresponding to the top angle structures 21c, 22d of the high-frequency signal transmission lines 21, 22.

Figure 14:
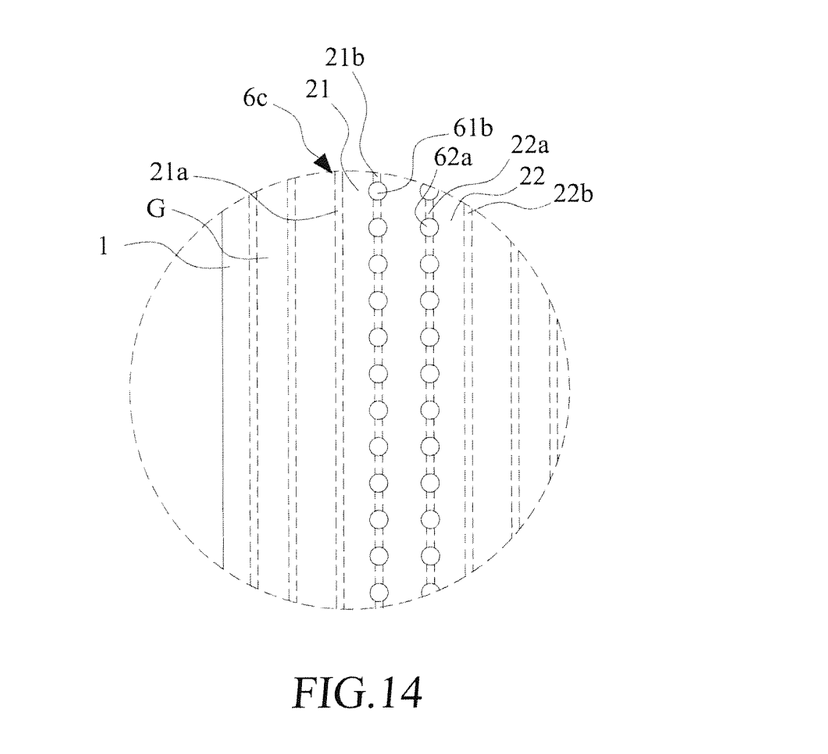
FIG. 14 is a bottom view showing a fourth embodiment of the present invention.
Figure 15:
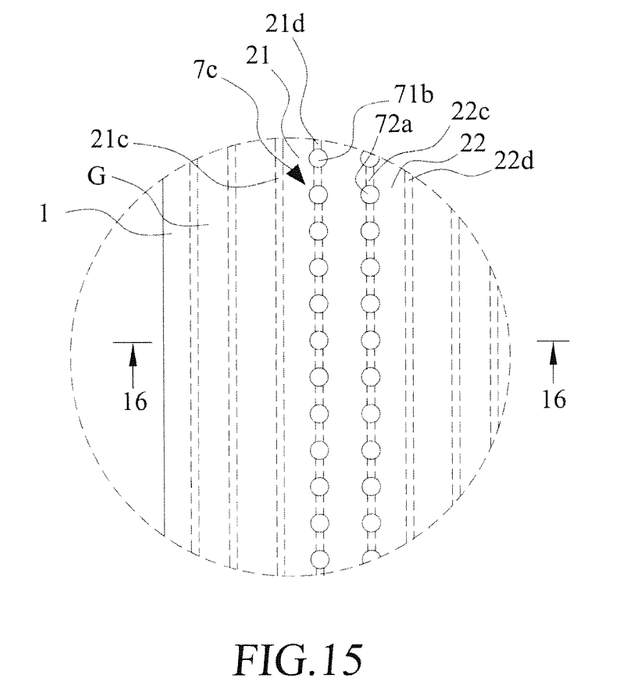
FIG. 15 is a top view showing the fourth embodiment of the present invention.
Figure 16:
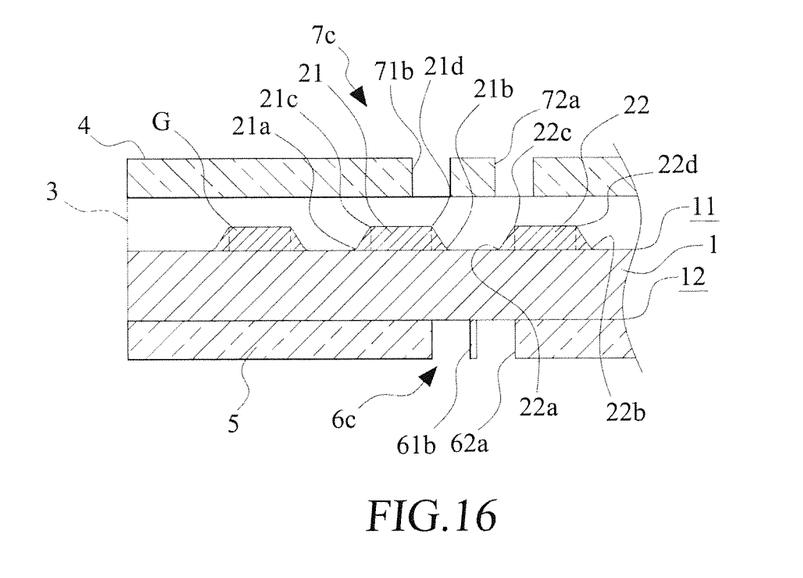
FIG. 16 is a cross-sectional view taken along line 16-16 of FIG. 15.

Referring to FIGS. 14-16, a fourth embodiment of the present invention is schematically shown. In the instant embodiment, a first attenuation reduction pattern 6c of an impedance control layer 5 comprises a plurality of openings 61b corresponding to a bottom angle structure 21b for high-frequency signal transmission line 21 and a plurality of openings 62a corresponding to a bottom angle structure 22a of a high-frequency signal transmission line 22. Corresponding to the first attenuation reduction pattern 6c, a conductive shielding layer 4 is formed with a plurality of openings 71b, 72a corresponding respectively to top angle structures 21d, 22c of the high-frequency signal transmission lines 21, 22.

Figure 17:
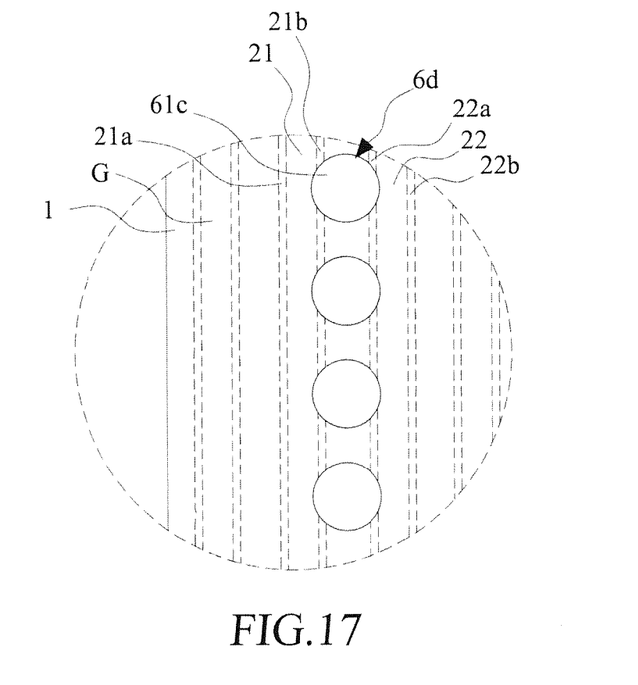
FIG. 17 is a bottom view showing a fifth embodiment of the present invention.
Figure 18:
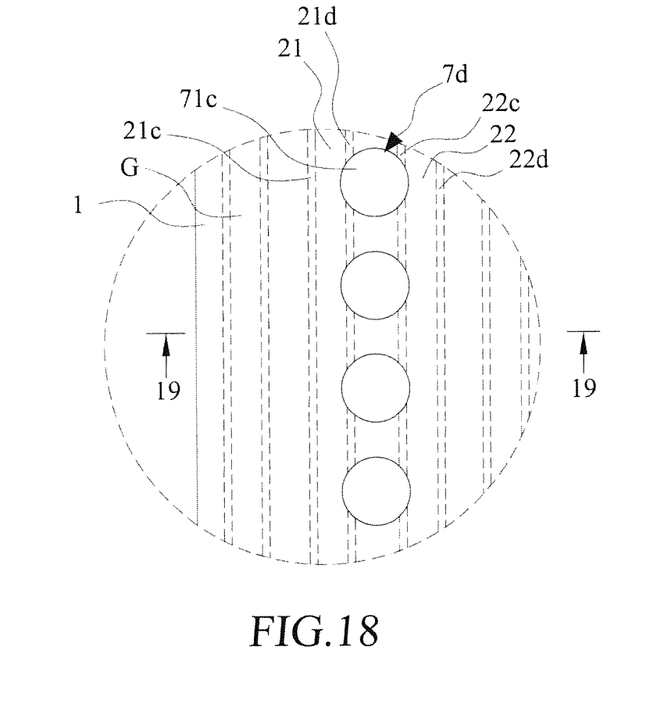
FIG. 18 is a top view showing the fifth embodiment of the present invention.
Figure 19:
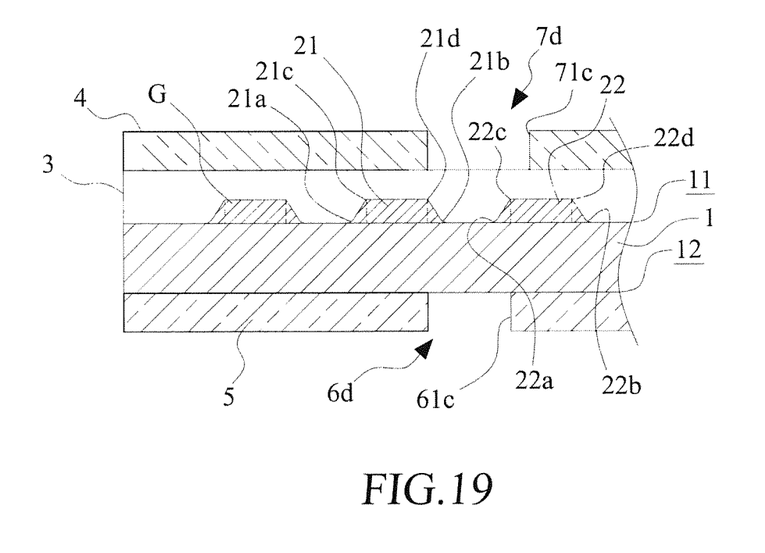
FIG. 19 is a cross-sectional view taken along line 19-19 of FIG. 18.

Referring to FIGS. 17-19, a fifth embodiment of the present invention is schematically shown. In the instant embodiment, a first attenuation reduction pattern 6d of an impedance control layer 5 comprises a plurality of diameter-enlarged openings 61c and the openings 61c each cover two adjacent high-frequency signal transmission lines 21, 22 and correspond to the bottom angle structure 21b of the high-frequency signal transmission line 21 and the bottom angle structure 22a of the high-frequency signal transmission line 22. Corresponding to the first attenuation reduction pattern 6d, a conductive shielding layer 4 is formed with a plurality of diameter-enlarged openings 71c corresponding to a top angle structure 21d of the high-frequency signal transmission line 21 and a top angle structure 22c of the high-frequency signal transmission line 22.

In a practical application, a high-frequency signal that is transmitted through the high-frequency signal transmission lines is provided with an excellent attenuation reduction effect with the attenuation reduction patterns according to the present invention so that the performance and reliability of signal transmission are both made excellent. Particularly, an excellent signal attenuation reduction effect can be obtained for transmission of a high-frequency signal through a flexible circuit board that is generally thin and light-weighted and is flexible.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board with an attenuation reduction control structure for high-frequency signal transmission lines of the flexible circuit board, comprising:
    a substrate, which comprises a first surface and a second surface;
    a plurality of extended high-frequency signal transmission lines, which is formed on the first surface of the substrate, the high-frequency signal transmission lines being spaced from each other by a predetermined distance, the high-frequency signal transmission lines each showing a slope shift amount so as to form at least one bottom angle structure and a top angle structure;
    a covering insulation layer, which covers the first surface of the substrate and surfaces of the high-frequency signal transmission lines;
    characterized in that:
    the second surface of the substrate comprises an impedance control layer formed thereon, the impedance control layer comprising a first attenuation reduction pattern formed in an extension direction of the high-frequency signal transmission lines, the first attenuation reduction pattern comprising a plurality of openings spaced from each other by a spacing distance, the openings corresponding to the bottom angle structures of the high-frequency signal transmission lines;

wherein the openings of the first attenuation reduction pattern have a greatest opening size that is less than a width of a bottom of the high-frequency signal transmission line.

2. The flexible circuit board as claimed in claim 1, wherein the openings of the first attenuation reduction pattern are each one of a circular opening, a rectangular opening, and a rhombus opening.

3. The flexible circuit board as claimed in claim 1, wherein the openings of the first attenuation reduction pattern each have a center position located exactly under the bottom angle structure.

4. The flexible circuit board as claimed in claim 1, wherein the impedance control layer is made of one of a silver-based material layer, an aluminum-based material layer, a copper-based material layer, a conductive carbon paste, a conductive particle included resin layer.

5. The flexible circuit board as claimed in claim 1, wherein the high-frequency signal transmission lines transmit at least one differential-mode signal.

6. The flexible circuit board as claimed in claim 1, wherein the first surface of the substrate comprises a conductive shielding layer formed thereon, the conductive shielding layer comprising a second attenuation reduction pattern formed in the extension direction of the high-frequency signal transmission lines, the second attenuation reduction pattern comprising a plurality of openings spaced from each other by a spacing distance, the openings corresponding to the top angle structures of the high-frequency signal transmission lines.

7. The flexible circuit board as claimed in claim 6, wherein the openings of the second attenuation reduction pattern are each one of a circular opening, a rectangular opening, and a rhombus opening.

8. The flexible circuit board as claimed in claim 6, wherein the openings of the second attenuation reduction pattern each have a center position located exactly above the top angle structure.

9. The flexible circuit board as claimed in claim 6, wherein the openings of the second attenuation reduction pattern have a greatest opening size that is less than a width of a top of the high-frequency signal transmission line.

10. The flexible circuit board as claimed in claim 6, wherein the conductive shielding layer is made of one of a silver-based material layer, an aluminum-based material layer, a copper-based material layer, a conductive carbon paste, a conductive particle included resin layer.

11. The flexible circuit board as claimed in claim 6, wherein the high-frequency signal transmission lines transmit at least one differential-mode signal.

12. A flexible circuit board with an attenuation reduction control structure for high-frequency signal transmission lines of the flexible circuit board, comprising:

a substrate, which comprises a first surface and a second surface;

a plurality of extended high-frequency signal transmission lines, which is formed on the first surface of the substrate, the high-frequency signal transmission lines being spaced from each other by a predetermined distance, the high-frequency signal transmission lines each showing a slope shift amount so as to form at least one bottom angle structure and a top angle structure;

a covering insulation layer, which covers the first surface of the substrate and surfaces of the high-frequency signal transmission lines;

characterized in that:

the first surface of the substrate comprises a conductive shielding layer formed thereon, the conductive shielding layer comprising a second attenuation reduction pattern formed in an extension direction of the high-frequency signal transmission lines, the second attenuation reduction pattern comprising a plurality of openings spaced from each other by a spacing distance, the openings corresponding to the top angle structures of the high-frequency signal transmission lines;

wherein the openings of the second attenuation reduction pattern have a greatest opening size that is less than a width of a top of the high-frequency signal transmission line.

13. The flexible circuit board as claimed in claim 12, wherein the openings of the second attenuation reduction pattern are each one of a circular opening, a rectangular opening, and a rhombus opening.

14. The flexible circuit board as claimed in claim 12, wherein the openings of the second attenuation reduction pattern each have a center position located exactly above the top angle structure.

15. The flexible circuit board as claimed in claim 12, wherein the conductive shielding layer is made of one of a silver-based material layer, an aluminum-based material layer, a copper-based material layer, a conductive carbon paste, a conductive particle included resin layer.

16. The flexible circuit board as claimed in claim 12, wherein the high-frequency signal transmission lines transmit at least one differential-mode signal.

17. A flexible circuit board with an attenuation reduction control structure for high-frequency signal transmission lines of the flexible circuit board, comprising:

a substrate, which comprises a first surface and a second surface;

a plurality of extended high-frequency signal transmission lines, which is formed on the first surface of the substrate, the high-frequency signal transmission lines being spaced from each other by a predetermined distance, the high-frequency signal transmission lines each showing a slope shift amount so as to form at least one bottom angle structure and a top angle structure;

a covering insulation layer, which covers the first surface of the substrate and surfaces of the high-frequency signal transmission lines;

characterized in that:

the second surface of the substrate comprises an impedance control layer formed thereon, the impedance control layer comprising a first attenuation reduction pattern formed in an extension direction of the high-frequency signal transmission lines, the first attenuation reduction pattern comprising a plurality of openings spaced from each other by a spacing distance, the openings corresponding to the bottom angle structures of the high-frequency signal transmission lines;

wherein the first surface of the substrate comprises a conductive shielding layer formed thereon, the conductive shielding layer comprising a second attenuation reduction pattern formed in the extension direction of the high-frequency signal transmission lines, the second attenuation reduction pattern comprising a plurality of openings spaced from each other by a spacing distance, the openings corresponding to the top angle structures of the high-frequency signal transmission lines; and the openings of the second attenuation reduction pattern have a greatest opening size that is less than a width of a top of the high-frequency signal transmission line.

18. The flexible circuit board as claimed in claim 17, wherein the openings of the first attenuation reduction pattern are each one of a circular opening, a rectangular opening, and a rhombus opening.

19. The flexible circuit board as claimed in claim 17, wherein the openings of the first attenuation reduction pattern each have a center position located exactly under the bottom angle structure.

20. The flexible circuit board as claimed in claim 17, wherein the impedance control layer is made of one of a silver-based material layer, an aluminum-based material layer, a copper-based material layer, a conductive carbon paste, a conductive particle included resin layer.

21. The flexible circuit board as claimed in claim 17, wherein the high-frequency signal transmission lines transmit at least one differential-mode signal.

22. The flexible circuit board as claimed in claim 17, wherein the openings of the second attenuation reduction pattern are each one of a circular opening, a rectangular opening, and a rhombus opening.

23. The flexible circuit board as claimed in claim 17, wherein the openings of the second attenuation reduction pattern each have a center position located exactly above the top angle structure.

24. The flexible circuit board as claimed in claim 17, wherein the conductive shielding layer is made of one of a silver-based material layer, an aluminum-based material layer, a copper-based material layer, a conductive carbon paste, a conductive particle included resin layer.

25. The flexible circuit board as claimed in claim 17, wherein the high-frequency signal transmission lines transmit at least one differential-mode signal.

\* \* \* \* \*